United States Patent [19]

Hartman

[11] Patent Number: 4,490,209
[45] Date of Patent: Dec. 25, 1984

[54] PLASMA ETCHING USING HYDROGEN BROMIDE ADDITION

[75] Inventor: Dennis C. Hartman, Plano, Tex.

[73] Assignee: Texas Instruments Incorporated, Dallas, Tex.

[21] Appl. No.: 566,128

[22] Filed: Dec. 27, 1983

[51] Int. Cl.³ .................... H01L 21/306; B44C 1/22; C03C 15/00; C03C 25/06
[52] U.S. Cl. .................... 156/643; 156/646; 156/657; 156/659.1; 156/662; 204/192 E; 252/79.1
[58] Field of Search ................ 252/79.1; 204/192 E; 156/643, 646, 657, 659.1, 662; 427/38, 39

[56] References Cited

U.S. PATENT DOCUMENTS 4,450,042  5/1984  Purdes .................... 156/659.1 X Primary Examiner—William A. Powell
Attorney, Agent, or Firm—Robert Groover; James T. Comfort; Melvin Sharp

[57] ABSTRACT

The disclosure relates to a plasma etch chemistry which allows a near perfectly anisotropic etch of silicon. A Cl-containing compound such as HCl has HBr added thereto, readily allowing the anisotropic etching of silicon. This is due to the low volatility of $SiBr_4$. The silicon surface facing the discharge is subjected to ion bombardment, allowing the volatilization (etching) of silicon as a Si-Cl-Br compound. The Br which adsorbs on the sidewalls of the etched silicon passivates them from the etching. This new plasma etch chemistry yields a very smooth etched surface, and the etch rate is relatively insensitive to the electrical conductivity of the silicon.

15 Claims, 1 Drawing Figure

PLASMA ETCHING USING HYDROGEN BROMIDE ADDITION

BACKGROUND OF THE INVENTION

1. Field of the Invention

This invention relates to anisotropic plasma etching of silicon.

2. Description of the Prior Art

Plasma etch processes currently used to etch materials for semiconductor device fabrication consist of an electrical discharge of halogen bearing gases. Halogens typically encountered in these processes are fluorine, chlorine and bromine. The process begins with application of a masking material, such as photoresist, to protect the desired geometries of the device from the etch process. The device in process is then placed in a plasma reactor and etched. The subsequent steps are determined by the type of device being fabricated. This process is especially valuable for the definition of small geometries on the order of one to five microns. For definition of geometries of less than one micron, it is essential that the etching proceed only in the vertical direction. The fragile nature of the small geometry structures cannot have a reasonable degree of reliability if any significant amount of undercutting takes place during the process.

A very common silicon etch process is based on fluorine. When mixtures such as $CF_4$-$O_2$ are dissociated in an electrical discharge, fluorine atoms are liberated, and volatilize the silicon as $SiF_4$. Such processes are isotropic; they etch in all directions at the same rate. Anisotropic, or vertical, etches in silicon are not observed when fluorine is the sole etchant.

In U.S. Pat. No. 4,226,665, Mogab describes etch chemistries which yield vertical etches. For vertical etching of silicon a chemistry such as $C_2F_6$-$Cl_2$ is indicated. The $C_2F_6$ serves as a source of "recombinants", such as $CF_3$. The recombinants suppress etching in the horizontal direction by recombining with Cl atoms, which have been adsorbed on the etched walls. Etching can proceed in the vertical direction because ion bombardment from the plasma suppresses the recombination mechanism.

Chemistries based on chlorine have been considered to be necessary for vertical etching of silicon, and discharges of pure $Cl_2$ have been found useful for this purpose. However, some silicon materials, such as highly doped polysilicon, still experience some undercutting if etch conditions are not closely controlled.

Furthermore, the use of chlorocarbons as the Cl source for etching polysilicon is not desirable. Selectivity to the underlying $SiO_2$ layer is a constant problem because the C is a good reducer of $SiO_2$, combining with the O to form CO and $CO_2$. A practical limit on the selectivity of doped polysilicon to $SiO_2$ appears to be roughly 20:1.

To improve upon this prior art, a plasma etch chemistry was developed which provides a near perfect anisotropic etch of silicon wherein a Cl containing compound such as $BCl_3$ with $Br_2$ added thereto is used.

However, bromine has disadvantages as an additive reagent. Bromine is a liquid source with a vapor pressure of 150 torr. at room temperature. Bromine tends to condense in the coolest section of the line. Heating of the line is required to eliminate condensation, particularly in the metering valves that regulate the flow.

SUMMARY OF THE INVENTION

In one aspect of the present invention, there is provided a plasma etch chemistry which has been shown to be capable of nearly perfectly vertical etching of silicon or materials having significant content of silicon, yet it does not present the problems noted above by the prior art. In a preferred embodiment, a Cl-containing compound such as HCl has HBr added thereto, and anisotropic etching is provided. This is accomplished by the adsorption of a Si-Br compound on the sidewalls of the etch cavity, while the ion bombardment on the flat surface inhibits the formation of the compound in that area. The silicon is etched as Si-Cl-Br compound.

The etch process consists of selectively etching a layer of silicon or silicon compound. The material is first masked then placed in a plasma reactor, where the plasma chemistry consists of hydrogen bromide and a chlorine gaseous compound.

BRIEF DESCRIPTION OF THE DRAWING

The FIGURE is a cross-sectional view showing the operation by the etch process of the present invention.

DETAILED DESCRIPTION OF THE INVENTION

Figure 1:
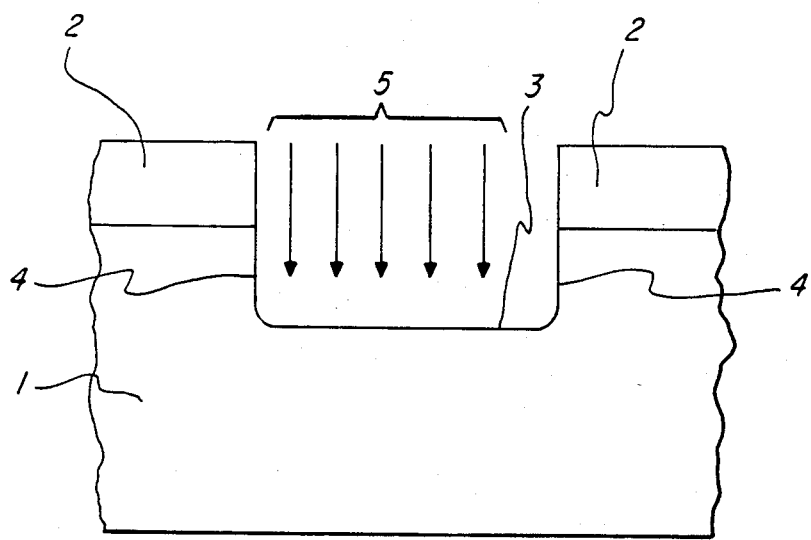

The present invention teaches that a highly anisotropic etch is achieved by the addition of hydrogen bromide to the silicon etching chemistry. Ion bombardment overcomes the resistance to etching on flat surfaces, but lateral etching is suppressed by the formation of a Si-Br compound on the sidwalls. Hydrogen bromide has a high vapor pressure (320 p.s.i.g.) at room temperature and is thus easier to handle.

A single-slice research plasma reactor was used for the following experiments. The wafers rested on the powered six inch diameter anodized aluminum electrode. The counter electrode was also anodized aluminum. The RF frequency was 13.56 MHz. The process conditions for the etching of heavily phosphorus doped polysilicon were as follows:

| | |
|---|---|
| HCl = | 100 sccm |
| He = | 200 sccm |
| Power = | 200 watts |
| Temp. = | 2° C. |
| Plate Spacing = | ¼ inch |
| Pressure = | 1.50 torr. |

The polysilicon etch rate was ~4000 Å/min. After 200% overetch, the polysilicon was severely undercut, indicating essentially isotropic etching was occurring. 120 Å of gate oxide was lost during the overetch.

The same process as above was used except HBr was added at a flow rate of 10 sccm. The polysilicon etch rate remained constant at ~4000 Å/min. After 200% overetch, SEM pictures indicated the process was highly anisotropic. Vertical wall profiles coincident with the photoresist were obtained. In addition, only 7 Å of gate oxide was removed, compared to 120 Å for the process without HBr.

Thus, when used under the proper conditions, it is apparent that HBr can prevent lateral etching and increase the selectivity to $SiO_2$. In an analogous reaction to $Br_2$, the HBr can scavenge free Cl atoms, i.e.

$Cl + HBr \rightarrow HCl + Br \Delta G°_{298} = -15.4$ kcal/mole, that apparently are the species participating in the lateral etching.

In addition to the prevention of undercutting in any Cl-containing etch, HBr addition can be used in a F-containing plasma. HBr reacts spontaneously with F atoms, i.e.

$$F + HBr \rightarrow HF + Br \, \Delta G°_{298} = -47.9 \text{ kcal/mole.}$$

This can be used to advantage to prevent undercutting caused by F atoms. The F/C ratio is an important parameter that can be related to the $SiO_2$ to silicon etch-rate ratio during $SiO_2$ etching. Since HBr can scavenge F atoms, it can be used to control the F/C ratio and thus the selectivity during $SiO_2$ etching.

The FIGURE is a cross-sectional view of the etch process of the present invention. The silicon material 1 is covered by an insulator 2 except in those areas where the surface 3 is to be etched. The ion bombardment 5 of the plasma discharge inhibits the formation of non-volatile compounds on the etch surface 3, but on the sidewalls of the etched cavity the non-volatile compound 4 forms and adsorbs on the sidewalls.

The results of the tests conducted indicate that the addition of hydrogen bromide to certain halogen-bearing gases contributes significantly to a nearly perfect vertical etch of silicon. In particular, the combination of HCl and HBr and a diluent such as He yields highly desirable results in that the etched surface of the silicon is very smooth. Therefore, the apparent improvements to the plasma etch process, in the form of increased etch rates and nearly perfect vertical etch (no undercutting), afforded by the present invention, will be immediately recognized by those skilled in the art.

It should be noted that, while the use of hydrogen bromide is crucial in achieving the advantage of the present invention, the use of HCl is not critical at all. A wide variety of other chlorine-bearing etchants can be substituted for the HCl, including but not limited to $SiCl_4$, $PCl_3$, $BCl_3$ or molecular chlorine. Moreover, a fluorine-bearing gas, or a fluorine and chlorine-bearing mixture can also alternatively be used as the etchant gas. Thus, for example, use of hydrogen bromide in combiantion with such etchant gas species as tetrafluoromethane, hexafluoromethane, octofluoropentane, trifluoromethane, trifluorochloromethane, difluorodichloromethane, fluorotrichloromethane, or a wide variety of others are in the scope of the present invention.

Similarly, other inert gases such as neon, argon, or nitrogen, can be substituted for helium.

Since the crucial advantage of the present invention is derived in large part from the function of silicon tetrabromide as a widewall passivation agent, the etch process taught by the present invention is applicable not only to crystalline silicon or polysilicon, but is also applicable to other contents which contain a large fraction of silicon. Thus, the etch mixture taught by the present invention is not only applicable to anisotropic etching of silicon nitride, but also is applicable to anisotropic etching of a wide variety of metal silicides. Where the present invention is applied to etching silicides, the etchant gas is preferably a gas containing both chlorine and fluorine-bearing species, to accomplish transport of the metal away from the etch cite. However, a mixture of hydrogen bromide with an etchant gas containing only chlorine-bearing species, or only fluorine-bearing species, is alternatively possible.

In the above example as applied to anisotropic etching of polysilicon there is used a pressure of 1.50 torr. RF power of 200 watts, a helium flow rate of 300 sccm, a hydrogen chloride flow rate of 100 sccm, and a hydrogen bromide flow rate of 10 sccm. However, polysilicon etching may be practiced with a broad range of substitutions in this preferred formula, including pressure in the range of 0.25 torr. to 5.0 torr., power density in the range of 1 to 30 watts per square inch, halogen-bearing gas flow in the range of 1 to 100 sccm, inert gas flow rate in the range of 0 to 30 times the flow rate of the halogen-bearing etchant, and hydrogen bromide flow rate in the range of about 1% to about 10% the flow rate of the halogen-bearing etchant based upon the weight ratio of the bromine in the hydrogen bromine to the halogen or halogens in the etchant chloride and/or fluoride.

Thus, the present invention provides the advantage of an anisotropic etch for silicon.

The present invention provides the further advantage of an anisotropic etch for silicon or polysilicon, which is insensitive to doping level.

The present invention provides the further advantage of a highly anisotropic etch for silicon-bearing materials, which is high insensitive to doping level.

The present invention provides the further advantage of a highly anisotropic etch for silicon, which leaves a clean etched surface.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. The method for selectively etching a layer of a silicon-bearing material in an integrated circuit, comprising the steps of:
   providing a patterned masking material over said silicon-bearing material to expose only the areas of said silicon-bearing material which are to be etched;
   passing a gaseous mixture over said layer; and
   creating a plasma discharge in said gaseous mixture adjacent to said layer of silicon-bearing material;
   wherein said gaseous mixture comprises hydrogen bromide and a chlorine-bearing species.

2. The method for selectively etching a layer of a silicon-bearing material in an integrated circuit, comprising the steps of:
   providing a patterned masking material over said silicon-bearing material to expose only the areas of said silicon-bearing material which are to be etched;
   passing a gaseous mixture over said layer; and
   creating a plasma discharge in said gaseous mixture adjacent to said layer of silicon-bearing material;
   wherein said gaseous mixture comprises hydrogen bromide, and at least one halogen bearing species taken from the class consisting of fluorine and chlorine.

3. The method of claim 1 wherein said chlorine-bearing species is selected from the group consisting of: silicon tetrachloride, carbon tetrachloride, phosphorus trichloride, chlorine and hydrogen chloride.

4. The method of claim 2 wherein said fluorine-bearing species is selected from the group consisting of tetrafluoromethane, hexafluoromethane and octofluoropentane.

5. The method of claim 2 wherein said gaseous mixture comprises a gas selected from the group consisting of: trifluoromethane, trifluorochloromethane, difluorodichloromethane and fluorotrichloromethane.

6. The method of claim 1 wherein the bromine-chlorine mole ratio is in the range of from about 1% to about 10%.

7. The method of claim 2 wherein the mole ratio of bromine to fluorine and/or chlorine is from about 1% to about 10%.

8. The method of claim 3 wherein the bromine-chlorine mole ratio is in the range of from about 1% to about 10%.

9. The method of claim 4 wherein the mole ratio of bromine to fluorine and/or chlorine is from about 1% to about 10%.

10. The method of claim 5 wherein the mole ratio of bromine to fluorine and/or chlorine is from about 1% to about 10%.

11. The method of claim 6 wherein the gaseous mixture includes an inert gas.

12. The method of claim 7 wherein the gaseous mixture includes an inert gas.

13. The method of claim 8 wherein the gaseous mixture includes an inert gas.

14. The method of claim 9 wherein the gaseous mixture includes an inert gas.

15. The method of claim 10 wherein the gaseous mixture includes an inert gas.

* * * * *

REEXAMINATION CERTIFICATE (3995th)

United States Patent [19]
Hartman

[11] B1 4,490,209
[45] Certificate Issued Feb. 15, 2000

[54] PLASMA ETCHING USING HYDROGEN BROMIDE ADDITION

[75] Inventor: Dennis C. Hartman, Plano, Tex.

[73] Assignee: Texas Instruments Incorporated, Dallas, Tex.

Reexamination Requests:
No. 90/005,036, Jul. 2, 1998
No. 90/005,131, Nov. 4, 1998

Reexamination Certificate for:
Patent No.: 4,490,209
Issued: Dec. 25, 1984
Appl. No.: 06/566,128
Filed: Dec. 27, 1983

[51] Int. Cl.$^7$ ............ H01L 21/306; B44C 1/22; C03C 15/00; C03C 25/06
[52] U.S. Cl. ............ 438/695; 252/79.1; 438/719
[58] Field of Search ............ 438/719, 723, 438/724, 733, 735, 743, 745, 695

[56] References Cited

U.S. PATENT DOCUMENTS

| | | |
|---|---|---|
| 4,162,185 | 7/1979 | Coburn et al. . |
| 4,208,241 | 6/1980 | Harshbarger . |
| 4,211,601 | 7/1980 | Mogab . |
| 4,352,724 | 10/1982 | Sughishima et al. . |
| 4,450,042 | 5/1984 | Purdes . |

FOREIGN PATENT DOCUMENTS

| | | |
|---|---|---|
| 2312114 | 12/1976 | France . |
| 26 17 483 | 12/1976 | Germany . |

OTHER PUBLICATIONS

Flamm et al., "The Design of Plasma Etchants," Plasma Chemistry and Plasma Processing, vol. No. 4 (1981), p. 317–363.

Declaration of Dr. John W. Coburn, executed on Jun. 21, 1996 (with attached Curriculum Vitae) filed in ITC Investigation No. 337–TA–381.

"Initial Determination Granting Respondents' Motion for Partial Summary Determination of Invalidity (Claims 1–3) of U.S. Pat. No. 4,490,209)," issued on Sep. 5, 1996.

HHMI Laboratory Safety Summary for Hydrogen Bromide.

HHMI Laboratory Safety Summary for Bromine.

*Primary Examiner*—William A. Powell

[57] ABSTRACT

The disclosure relates to a plasma etch chemistry which allows a near perfectly anisotropic etch of silicon. A Cl-containing compound such as HCl has HBr added thereto, readily allowing the anisotropic etching of silicon. This is due to the low volatility of $SiBr_4$. The silicon surface facing the discaharge is subjected to ion bombardment, allowing the volatilization (etching) of silicon as a Si-Cl-Br compound. The Br which adsorbs on the sidewalls of the etched silicon passivates them from the etching. This new plasma etch chemistry yields a very smooth etched surface, and the etch rate is relatively insensitive to the electrical conductivity of the silicon.

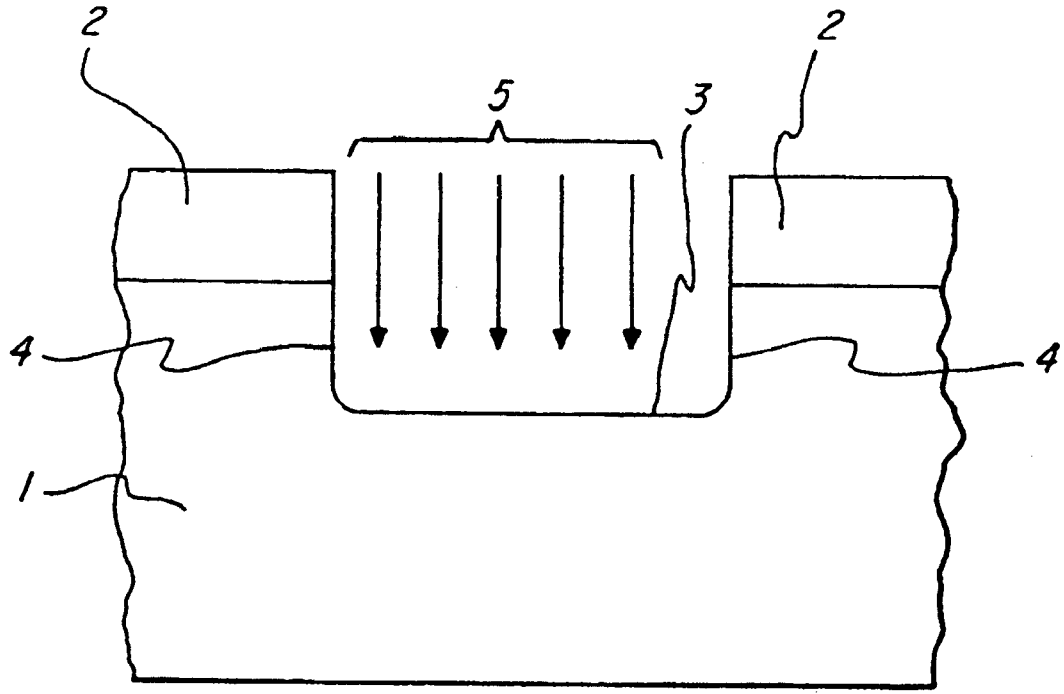

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 5–15 is confirmed.

Claims 1–4 are cancelled.

New claims 16–21 are added and determined to be patentable.

*16. A method for selectively etching of a silicon-bearing material in an integrated circuit, said method comprising the steps of:*

*providing a patterned masking material over said silicon-bearing material to expose only the areas of said silicon-bearing material which are to be etched;*

*passing a gaseous mixture over said layer, said gaseous mixture comprises hydrogen bromide and a chlorine-bearing species;*

*creating a plasma discharge in said gaseous mixture adjacent to said layer of silicon-bearing material;*

*and wherein sidewalls of regions of said silicon-bearing material which are etched during said method of selectively etching said layer of silicon-bearing material are passivated during said method of selectively etching said layer of silicon-bearing material.*

*17. The method of claim 16, wherein said chlorine-bearing species is selected from the group consisting of: silicon tetrachloride, carbon tetrachloride, phosphorus trichloride, chlorine and hydrogen chloride.*

*18. The method of claim 16, wherein said chlorine-bearing species is chlorine.*

*19. The method of claim 17, wherein said mixture includes an inert gas.*

*20. The method of claim 16, wherein said passivation of said sidewalls of regions of said silicon-bearing material which are etched is accomplished by silicon tetrabromide.*

*21. The method of claim 16, wherein said sidewalls of regions of said silicon-bearing material which are etched are substantially vertical.*

* * * * *

REEXAMINATION CERTIFICATE (4237th)

United States Patent [19]
Hartman

[11] B2 4,490,209
[45] Certificate Issued Dec. 19, 2000

[54] PLASMA ETCHING USING HYDROGEN BROMIDE ADDITION

[75] Inventor: Dennis C. Hartman, Plano, Tex.

[73] Assignee: Texas Instruments Incorporated, Dallas, Tex.

Reexamination Request:
No. 90/005,442, Aug. 3, 1999

Reexamination Certificate for:
Patent No.: 4,490,209
Issued: Dec. 25, 1984
Appl. No.: 06/566,128
Filed: Dec. 27, 1983

Reexamination Certificate B1 4,490,209 issued Feb. 15, 2000

[51] Int. Cl.[7] .................................................. H01L 21/311
[52] U.S. Cl. .................. 438/695; 252/79.1; 204/192.37; 438/719; 438/696; 438/700; 438/733; 438/963
[58] Field of Search ............................. 252/79.1; 216/67, 216/79; 438/695, 719, 723, 724, 733, 735, 743

[56] References Cited

U.S. PATENT DOCUMENTS 4,162,185   7/1979   Coburn et al. .
4,208,241   6/1980   Harshbarger .
4,211,601   7/1980   Mogab .
4,352,724   10/1982  Sughishima et al. .
4,450,042   5/1984   Purdes .

FOREIGN PATENT DOCUMENTS 2617483   12/1976   Germany .

OTHER PUBLICATIONS

Flamm et al., "The Design of Plasma Etchants," Plasma Chemistry and Plasma Processing, vol. No. 4, p. 317–363, 1981.
Declaration of Dr. John W. Coburn, executed on Jun. 21, 1996 (with attached Curriculum Vitae) filed in ITC Investigation No. 337–TA–381.
"Initial Determination Granting Respondents' Motion for Partial Sumary Determination of Invalidity (Clamin 1–3) of U.S. Pat. No. 4,490209," issued on Sep. 5, 1996.
HHMI Laboratory Safety Summary for Hydrogen Bromide.
HHI Laboratory Safety Summary for Bromide.

*Primary Examiner*—William A. Powell

[57] ABSTRACT

The disclosure relates to a plasma etch chemistry which allows a near perfectly anisotropic etch of silicon. A Cl-containing compound such as HCl has HBr added thereto, readily allowing the anisotropic etching of silicon. This is due to the low volatility of $SiBr_4$. The silicon surface facing the discaharge is subjected to ion bombardment, allowing the volatilization (etching) of silicon as a Si-Cl-Br compound. The Br which adsorbs on the sidewalls of the etched silicon passivates them from the etching. This new plasma etch chemistry yields a very smooth etched surface, and the etch rate is relatively insensitive to the electrical conductivity of the silicon.

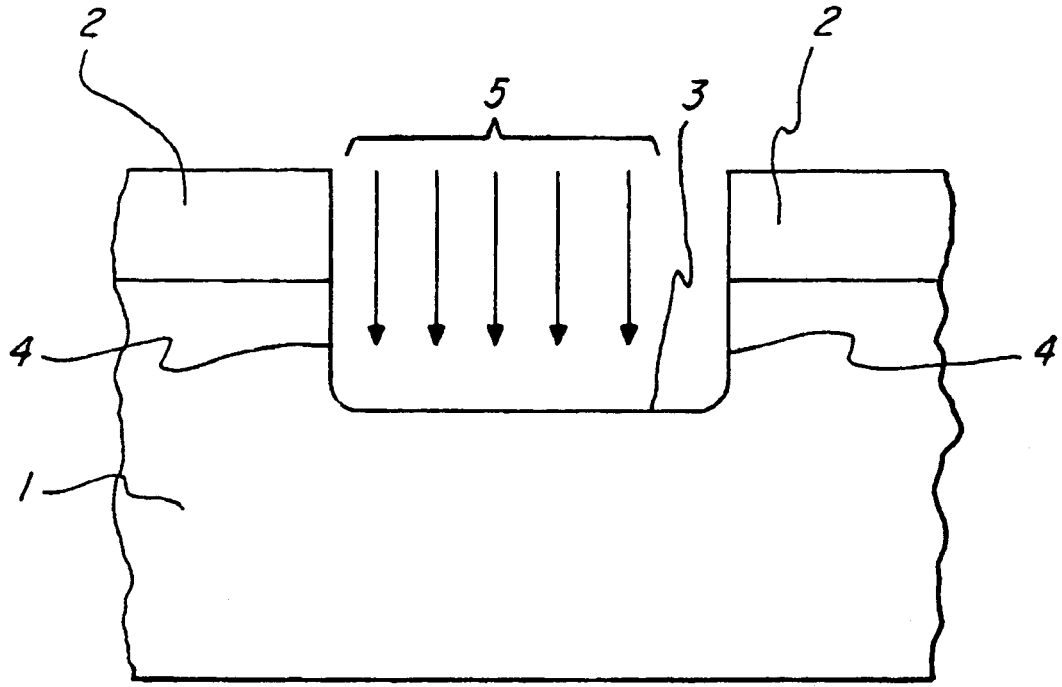

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 5–21 is confirmed.

Claims 1–4 were previously cancelled.

* * * * *